(12) United States Patent
Korthout et al.

(10) Patent No.: US 7,551,215 B2
(45) Date of Patent: Jun. 23, 2009

(54) CMOS-BASED SENSOR APPARATUS WITH CELLS THAT COMPRISE A REDUNDANCY FACILITY THAT IS SELECTIVELY ACTIVATABLE FOR ISOLATING A METAL-TO-METAL SHORT ON THE BASIS OF EXTERNALLY APPLIED CONTROL ACTUATION

(75) Inventors: Alouisius Wilhelmus Marinus Korthout, Drunen (NL); Daniel Wilhelmus Elisabeth Verbugt, Helden (NL)

(73) Assignee: DALSA Corporation, Waterloo (CA)

( * ) Notice: Subject to any disclaimer, the term of this patent is extended or adjusted under 35 U.S.C. 154(b) by 664 days.

(21) Appl. No.: 11/374,963

(22) Filed: Mar. 15, 2006

(65) Prior Publication Data

US 2007/0216788 A1 Sep. 20, 2007

(51) Int. Cl.
*H04N 3/14* (2006.01)
*H04N 5/335* (2006.01)
*H05G 1/64* (2006.01)

(52) U.S. Cl. ..................................... 348/308; 378/98.8
(58) Field of Classification Search ................. 348/308, 348/292, 294, 301, 302; 250/208.1; 378/98.8
See application file for complete search history.

(56) References Cited

U.S. PATENT DOCUMENTS

| | | | |
|---|---|---|---|
| 5,111,060 A | 5/1992 | Asada | |
| 6,266,037 B1 * | 7/2001 | Flasck | 257/E27.081 |
| 6,295,142 B1 | 9/2001 | Watanabe et al. | |
| 2002/0113766 A1 | 8/2002 | Kenney et al. | |
| 2005/0051775 A1 * | 3/2005 | Meynants | 257/72 |
| 2005/0092895 A1 * | 5/2005 | Fossum | 250/208.1 |
| 2006/0146159 A1 * | 7/2006 | Farrier | 348/308 |

* cited by examiner

*Primary Examiner*—Lin Ye
*Assistant Examiner*—Jason Whipkey
(74) *Attorney, Agent, or Firm*—Fisher Technology Law PLLC

(57) ABSTRACT

A CMOS-based sensor apparatus comprises an array of sensor cells that are interconnected by a first set of vertical driver lines to a selective driver facility and by a second set of horizontal sensing lines to a sensing facility for sensing respectively sensed amounts of radiation.

In particular, the sensor cells through being appropriately spaced in at least either row or column direction, comprise a redundancy facility that is selectively activatable for isolating an interconnect short on the basis of externally applied control actuation.

9 Claims, 3 Drawing Sheets

CMOS-BASED SENSOR APPARATUS WITH CELLS THAT COMPRISE A REDUNDANCY FACILITY THAT IS SELECTIVELY ACTIVATABLE FOR ISOLATING A METAL-TO-METAL SHORT ON THE BASIS OF EXTERNALLY APPLIED CONTROL ACTUATION

BACKGROUND OF THE INVENTION

The invention relates to a CMOS sensor array for sensing an X-ray-produced image such as without limitation being for use in medical diagnosis and as being furthermore recited in the preamble of claim 1. CMOS sensor arrays have many advantages but with larger size the number of column defects will increase. In particular, the metal interconnect in such CMOS devices is sensitive to defects caused by shorts between adjacent metal tracks. With large-area imagers this effect may cause severe yield losses. In fact, shorts between interconnect tracks in the pixel array can lead to complete dead columns and/or rows. It is to be noted that in this application with the word metal not only metals are meant but also other conductors such as conducting compounds like silicides or other conducting materials like polycrystalline silicon.

Now, in various new developments, such as X-ray-photography, the pixel size need not be so small, but may lie at 20, 50, or even 100 microns. This design specification will also allow to increase the metal-to-metal distance. The present inventors have recognized that such in its turn would allow to use redundancy within the cell by only doubling a part thereof and upon detecting a failure, selecting the redundant part instead of the originally used part. In case a defect is detected and the redundancy is activated, the redundant elements of all pixels in the entire row and/or column will be activated. In the above, the notions of horizontal and vertical are exchangeable. Moreover, in principle a geometrical row or column may electrically be divided into sub-columns. Also the control facility may comprise various sub-items, such as selection, reset and other.

SUMMARY TO THE INVENTION

In consequence, amongst other things, it is an object of the present invention to render CMOS sensing arrays permanently repairable without disabling particular cell locations as regards their sensing utility.

Now therefore, according to one of its aspects, the invention is characterized according to the characterizing part of claim 1. The combination of in-cell redundancy and external or peripheral control therefore offers an optimum combination of robustness and simplicity. The protection may work against metal-to-metal or against other interconnect shorts, such as poly shorts. In particular, the redundancy facility is selectively activatable at either said control facility and/or at said sensing facility. In particular, the redundancy can be made permanently operating as a post-manufacturing device. Field-repair can be useful in this manner. Various fault types will so be made remediable.

According to preferred embodiments, the redundancy facility is represented by either a cell-wise redundant output stage, and/or by a cell-wise redundant control facility. Although various solutions are feasible in principle, the latter implementations have been considered particular advantageous.

Further advantageous aspects of the invention are recited in dependent Claims.

BRIEF DESCRIPTION OF THE DRAWING

These and further features, aspects and advantages of the invention will be discussed more in detail hereinafter with reference to the disclosure of preferred embodiments of the invention, and in particular with reference to the appended Figures that illustrate.

DETAILED DESCRIPTION OF PREFERRED EMBODIMENTS

Figure 1:
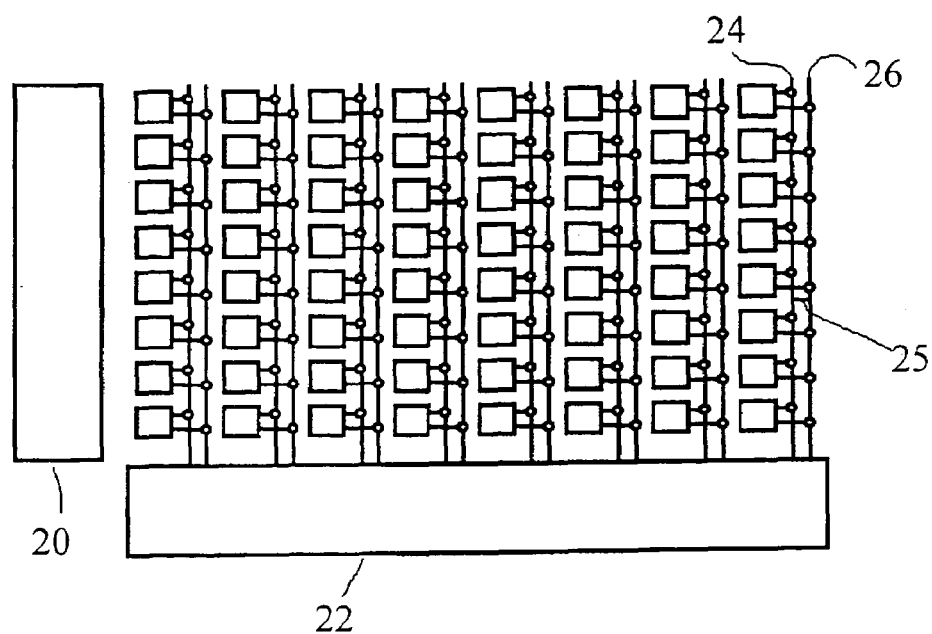
FIG. 1, a general view of a sensor array with peripheral control and read-out circuitry.

FIG. 1 illustrates a general view of a sensor array with peripheral control and read-out circuitry. Although for many purposes such as still photography, the size of the sensor cells or pixels is made as small as possible to attain a high image resolution, for other applications such as medical imagery the size need not go below a certain size, such as 20, 50, or even 100 microns. The inventors have recognized that present-day sophisticated CMOS technology will allow the use of extra in-pixel circuitry for these relatively large pixel areas without appreciably decreasing the photosensitive area of the pixel, and so maintaining output signal level.

Now in particular, the exemplary array has 8×8=64 pixels or cells, that have been shown without detailing the cell area. Item 20 is the set of vertical drivers that access the array from the left. Item 22 is the set of column read-out circuits that read out the cells via two interconnect lines per column. For the right-most column these two interconnect lines have been identified as 24 and 26, respectively. A short between those two lines such as indicated by 25 would generally render the whole column ineffective, which would be very visible in a picture as sensed. In a similar manner, a short between horizontal interconnect lines would be very detrimental for overall operation of the array. Note also that vertical and horizontal directions can be interchanged.

Figure 2:
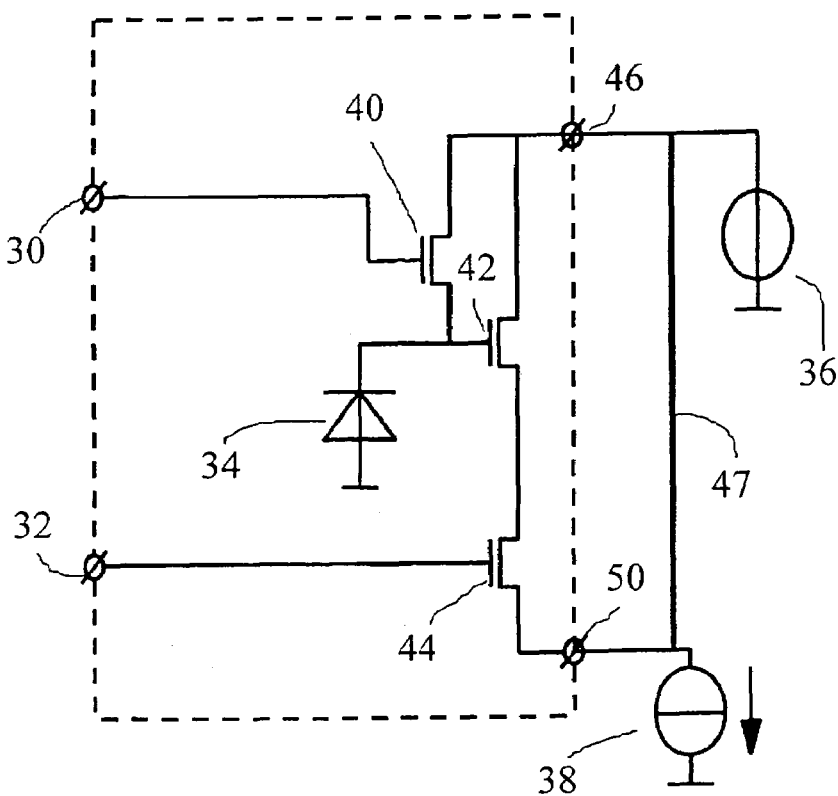
FIG. 2, a circuitry setup of a single cell without redundancy and including a short in the column interconnect.

FIG. 2 illustrates a circuitry setup of a single cell without redundancy and including a short 47 between two terminals 46 and 50 that in the arrangements of FIG. 1 may operate as column interconnect 25. For simplicity, no polarities have been shown. The three-transistor embodiment has select terminal 32, reset terminal 30, reference voltage supply 36 connected to terminal 46, and signal output terminal 50. The photo diode sensor element is item 34 that has an associated accumulation parallel capacitance not shown for clarity. Liberated charges accumulate on the total capacitance of PD, Reset, and source follower gate. Now, operational transistors 40, 42, 44 will control the operation as follows. Reset on terminal 30 will short transistor 40 to reference voltage 36. Isolation through transistor 40 will allow to charge the diode capacitance. Transistor 42 operates as source follower. Readout control ensues through select on terminal 32, which renders transistor 44 conductive to column readout terminal 50, thereby having the latter copy the photodiode voltage.

Now as shown, terminals 46 and 50 have been interconnected by a short 47. Therefore, no useful signal can be derived from the cell in question. Moreover, inasmuch as items 36 and 38 are common to all cells of a single column, usually a whole column will then be defective.

Figure 3:
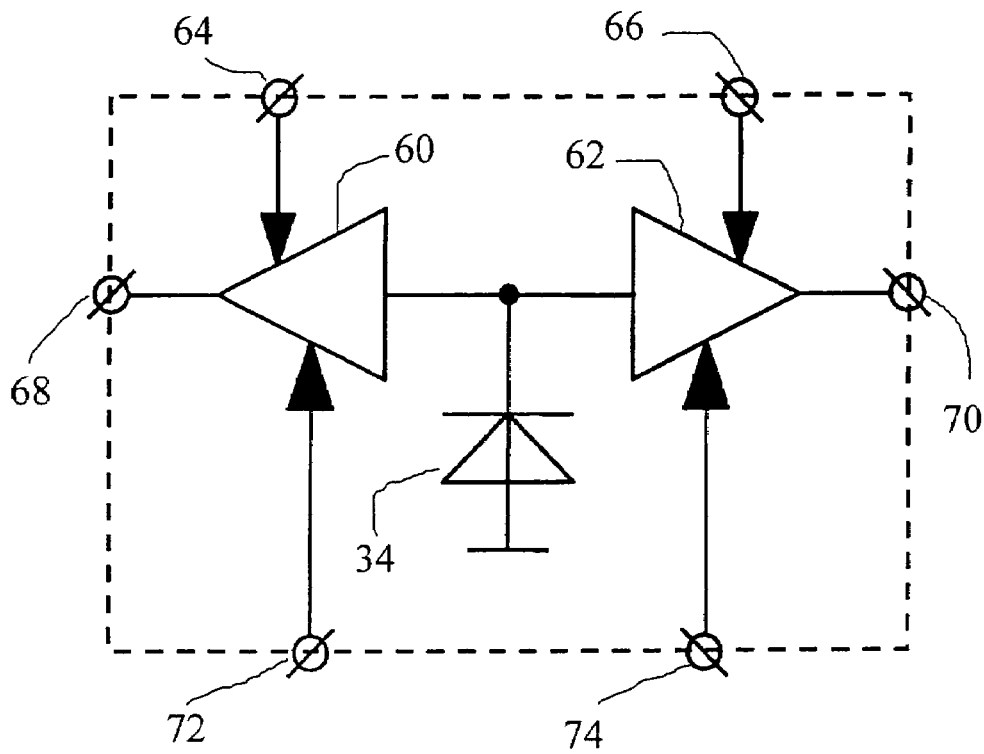
FIG. 3, an array pixel provided with redundant output stage and pixel control signals.

FIG. 3 illustrates an array pixel provided with redundant output stage and pixel control signals. Sensor element 34 has been shown as in FIG. 2. The remainder of the cell has been doubled. Each half has a reference voltage terminal 64, 66 (cf. item 46). Each half also has output circuit 60, 62 that represents the three-transistor circuit (items 40, 42, 44) of FIG. 2, but which has not been detailed to transistor level. Each output circuit 60, 62 feeds associated output terminal 68 and 70, respectively, that represent single output terminal 50 in FIG. 2. Control signal input terminals 72 and 74 select only a single one of the two half circuits 60, 62. These terminals can have multiple signals per pin, such as in case of their representing a bus. Typically, reference signal input and column output run adjacently to each other in the respective columns. The pixel control signals are typically supplied from the vertical drivers.

Figure 4:
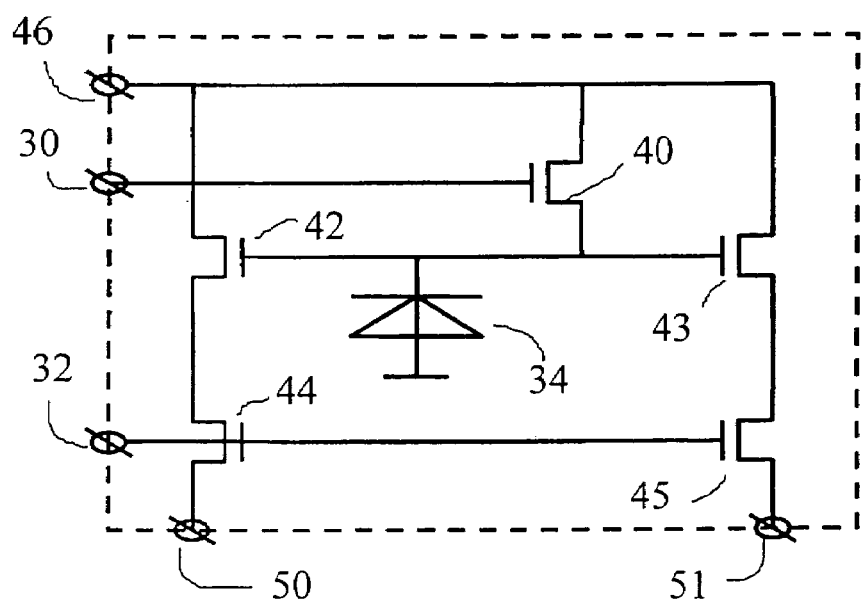
FIG. 4, a possible array pixel provided with a redundant output amplifier stage.

FIG. 4 illustrates a possible array pixel provided with a redundant output amplifier stage. In comparison with the arrangement of FIG. 3, here only transistors 43 and 45 have been doubled next to transistors 42 and 44. Also two output terminals 50, 51 have been provided. In contradistinction, transistor 40 and terminals 30, 32 and 46 have been used in common for the two column channels. An advantage of the present embodiment is of course the lesser provision of wiring. In application, terminals 50, 51 connect to respective current sources and a hold capacitor that is multiplexed between those terminals.

Figure 5:
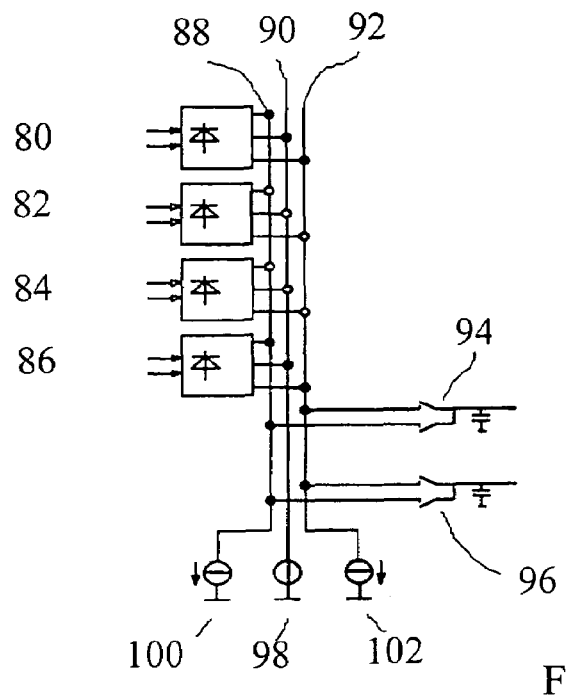
FIG. 5, a column of array pixels provided with a redundant output stage.

FIG. 5 illustrates a column of four array pixels 80, 82, 84, 86 provided with a redundant output stage. Like in FIG. 4, each pixel has reset and select terminals at left. At right, each pixel attaches in parallel to first and second common output lines 88, 92, and likewise to common reference voltage line 90. At the bottom of the figure, line 90 attaches to reference voltage source 98, whereas lines 88, 92 attach to current sources 100 and 102, respectively. At lower right, the output lines each attach to a multiplexer circuit 94, 96 that feed a capacitive output impedance C. Further external application circuitry, such as for sample and hold, has been omitted for brevity.

Figure 6:
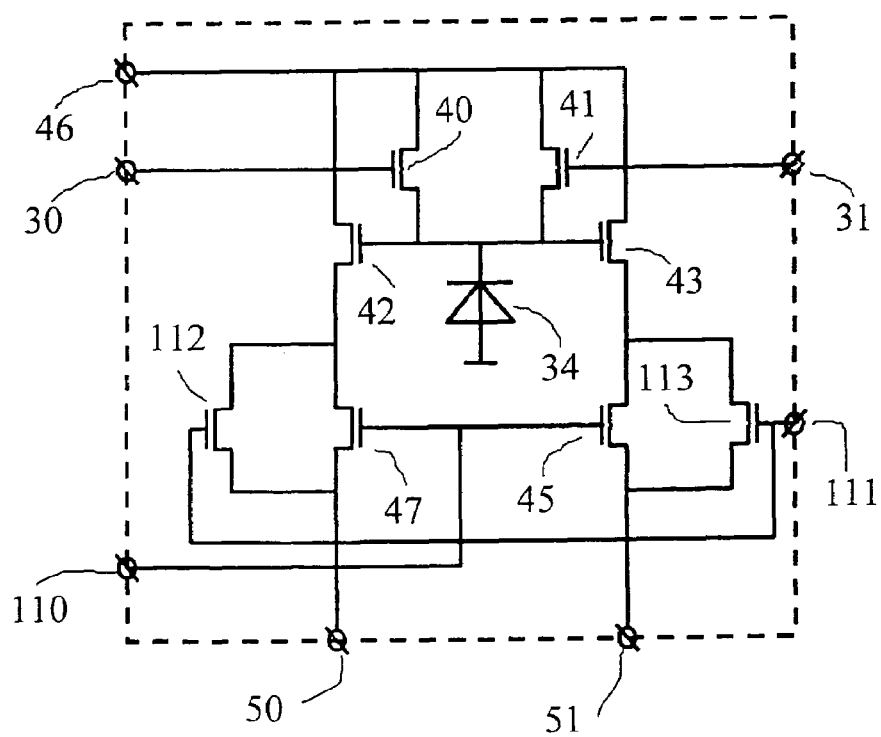
FIG. 6, a classical 3T array pixel with redundant amplifier, reset and select transistor.

FIG. 6 illustrates a classical 3T array pixel with redundant amplifier, reset and select transistor. Note that the present invention does not restrict to particular cell set-ups. In fact, the art has produced 4T, 5T, etcetera configurations. In consequence, the circuit has been extended with respect to FIG. 4, and like reference numerals indicate corresponding elements as in FIG. 4. Additional elements are second reset terminal 31, first and second select terminals 110, 111, and further select transistors 112 and 113. Finally, select transistor 44 in FIG. 4 has been retyped to select transistor 47 in FIG. 6.

In view of the available space within the array cells, each cell could comprise a cell-wise data processing facility as pertaining to said respectively sensed amounts of radiation. Such "smart electronics" could relate to an analog/digital convertor, a parallel-to-series converter for the digital signal so produced, or various other items. Persons skilled in the art would readily design such processing circuit.

Now, the present invention has hereabove been disclosed with reference to preferred embodiments thereof. Persons skilled in the art will recognize that numerous modifications and changes may be made thereto without exceeding the scope of the appended claims . In consequence, the embodiments should be considered as being illustrative, and no restriction should be construed from those embodiments, other than as have been recited in the claims .

The invention claimed is:

1. A CMOS-based sensor apparatus comprising an array of sensor cells that are interconnected by a first set of vertical driver lines to a selective control facility and by a second set of horizontal sensing lines to a sensing facility for sensing respectively sensed amounts of radiation, said apparatus being characterized in that said sensor cells through being appropriately spaced in at least either row or column direction, comprise a redundancy facility that is selectively activatable for isolating an interconnect short on the basis of externally applied control actuation.

2. An apparatus as claimed in claim 1, wherein said sensing facility is collective to a plurality of sensor cells.

3. An apparatus as claimed in claim 1, for isolating a metal-to-metal short.

4. An apparatus as claimed in claim 1, wherein said redundancy facility is selectively activatable at either said control facility and/or at said sensing facility.

5. An apparatus as claimed in claim 4, wherein said redundancy facility is represented by a redundant output amplifier.

6. An apparatus as claimed in claim 5, wherein said redundancy facility is represented by a cell-wise redundant output stage.

7. An apparatus as claimed in claim 4, wherein said redundancy facility is represented by a cell-wise redundant control facility.

8. An apparatus as claimed in claim 4, wherein said redundancy facility has been made permanently operative as a post-manufacturing device.

9. An apparatus as claimed in claim 1, and furthermore comprising a cell-wise data processing facility as pertaining to said respectively sensed amounts of radiation.

* * * * *